United States Patent
Luo et al.

(10) Patent No.: US 12,164,808 B2
(45) Date of Patent: Dec. 10, 2024

(54) QUAD-DATA-RATE (QDR) HOST INTERFACE IN A MEMORY SYSTEM

(71) Applicant: Rambus Inc., San Jose, CA (US)

(72) Inventors: Lei Luo, Chapel Hill, NC (US); John C Eble, III, Chapel Hill, NC (US)

(73) Assignee: Rambus Inc., San Jose, CA (US)

( * ) Notice: Subject to any disclaimer, the term of this patent is extended or adjusted under 35 U.S.C. 154(b) by 29 days.

(21) Appl. No.: 17/962,362

(22) Filed: Oct. 7, 2022

(65) Prior Publication Data

US 2023/0112159 A1 Apr. 13, 2023

Related U.S. Application Data

(60) Provisional application No. 63/254,942, filed on Oct. 12, 2021.

(51) Int. Cl.
*G06F 12/00* (2006.01)
*G06F 3/06* (2006.01)

(52) U.S. Cl.
CPC .......... *G06F 3/0659* (2013.01); *G06F 3/0607* (2013.01); *G06F 3/0683* (2013.01)

(58) Field of Classification Search
CPC ..... G06F 3/0607; G06F 3/0659; G06F 3/0683
See application file for complete search history.

(56) References Cited

U.S. PATENT DOCUMENTS

| | | |
|---|---|---|
| 6,779,075 B2 | 8/2004 | Wu et al. |
| 7,356,639 B2 | 4/2008 | Perego et al. |
| 7,502,880 B2 | 3/2009 | Gaskins |
| 7,685,364 B2 | 3/2010 | Shaeffer et al. |
| 7,739,441 B1 | 6/2010 | Lee et al. |
| 9,653,146 B2 | 5/2017 | Ware et al. |
| 10,146,711 B2 | 12/2018 | Nale et al. |
| 10,268,607 B2 | 4/2019 | Zheng et al. |
| 10,866,916 B2 | 12/2020 | Amirkhany et al. |
| 10,884,639 B2 | 1/2021 | Wang et al. |
| 2002/0174274 A1* | 11/2002 | Wu ............... G06F 13/1689 710/100 |
| 2014/0325105 A1 | 10/2014 | Prete et al. |
| 2018/0225235 A1 | 8/2018 | Lee |
| 2020/0075079 A1 | 3/2020 | Kim et al. |

* cited by examiner

*Primary Examiner* — Yong J Choe
(74) *Attorney, Agent, or Firm* — Lowenstein Sandler LLP (57) ABSTRACT

Technologies for converting quad data rates on a host interface to double data rates on a memory interface are described. One memory module includes a data buffer device with a host-side interface circuit that sends or receives first data to and from a host device at a quad data rate and a memory-side interface circuit that sends or receives second data to and from a set of memory devices at a first specified data rate that is less than the quad data rate. The memory module includes conversion circuitry to down-convert the first data at the quad data rate to the second data at the first specified data rate and up-convert the second data at the first specified data rate to the first data at the quad data rate.

19 Claims, 7 Drawing Sheets

FIG. 3B
QDR to DDR conversion

FIG. 3C

FIG. 3D
DDR to QDR conversion

QUAD-DATA-RATE (QDR) HOST INTERFACE IN A MEMORY SYSTEM

RELATED APPLICATIONS

This application claims the benefit of U.S. Provisional Application No. 63/254,942, filed Oct. 12, 2021, the entire contents of which are incorporated by reference.

BACKGROUND

Modern computer systems generally include a data storage device, such as a memory component or device. The memory component may be, for example, a random access memory (RAM) device or a dynamic random access memory (DRAM) device. The memory device includes memory banks made up of memory cells that a memory controller or memory client accesses through a command interface and a data interface within the memory device.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details, such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or presented in simple block diagram format to avoid obscuring the present disclosure unnecessarily. Thus, the specific details set forth are merely exemplary. Particular implementations may vary from these exemplary details and still be contemplated to be within the scope of the present disclosure.

Aspects of the present disclosure may be used to increase the data rate of a host interface of a memory module (e.g., DIMM), increasing bandwidth to improve system performance. The DB device can be an integrated circuit with circuitry to buffer data between a host device and one or more memory devices. The RCD can be an integrated circuit that operates as a command buffer device for CA and control signals for the DRAM devices. The RCD can perform re-clocking, re-driving, and signal registration of these signals and can be a control path for controlling the DRAM devices. Aspects of the present disclosure provide for embodiments of a memory module (e.g., a dual in-line memory module (DIMM)) that may increase the CPU to DIMM data rate while still keeping RCD/DB to DRAM data rates the same. That is, the DRAM devices still operate at DDR (with respect to the DRAM clock), while the host interface operates at QDR (with respect to the DRAM clock). Unless specifically stated otherwise, it is appreciated that throughout the description, discussions utilizing the term "DDR" refer to the general concept of transferring two bits on a data line with respect to each clock cycle of a reference clock, and not any JEDEC standard. Similarly, unless specifically stated otherwise, it is appreciated that throughout the description, discussions utilizing the term "QDR" refer to the general concept of transferring four bits on a data line with respect to each clock cycle of a reference clock, and not any JEDEC standard.

In at least one embodiment, a host interface of a DIMM can double the data rate from DDR5 6.4 Gbps to 12.8 Gbps, and a DRAM interface of the DIMM has the same DRAM interface data rates as DDR5, including 6.4 Gbps for DQ and 3.2 Gbps for QCA. In one embodiment, an RCD to DB interface of the DIMM can be doubled or operated at a data rate of 6.4 Gbps to double the bandwidth of control information to a set of DB devices for the same number of pins as the DDR5 standard.

Figure 1:
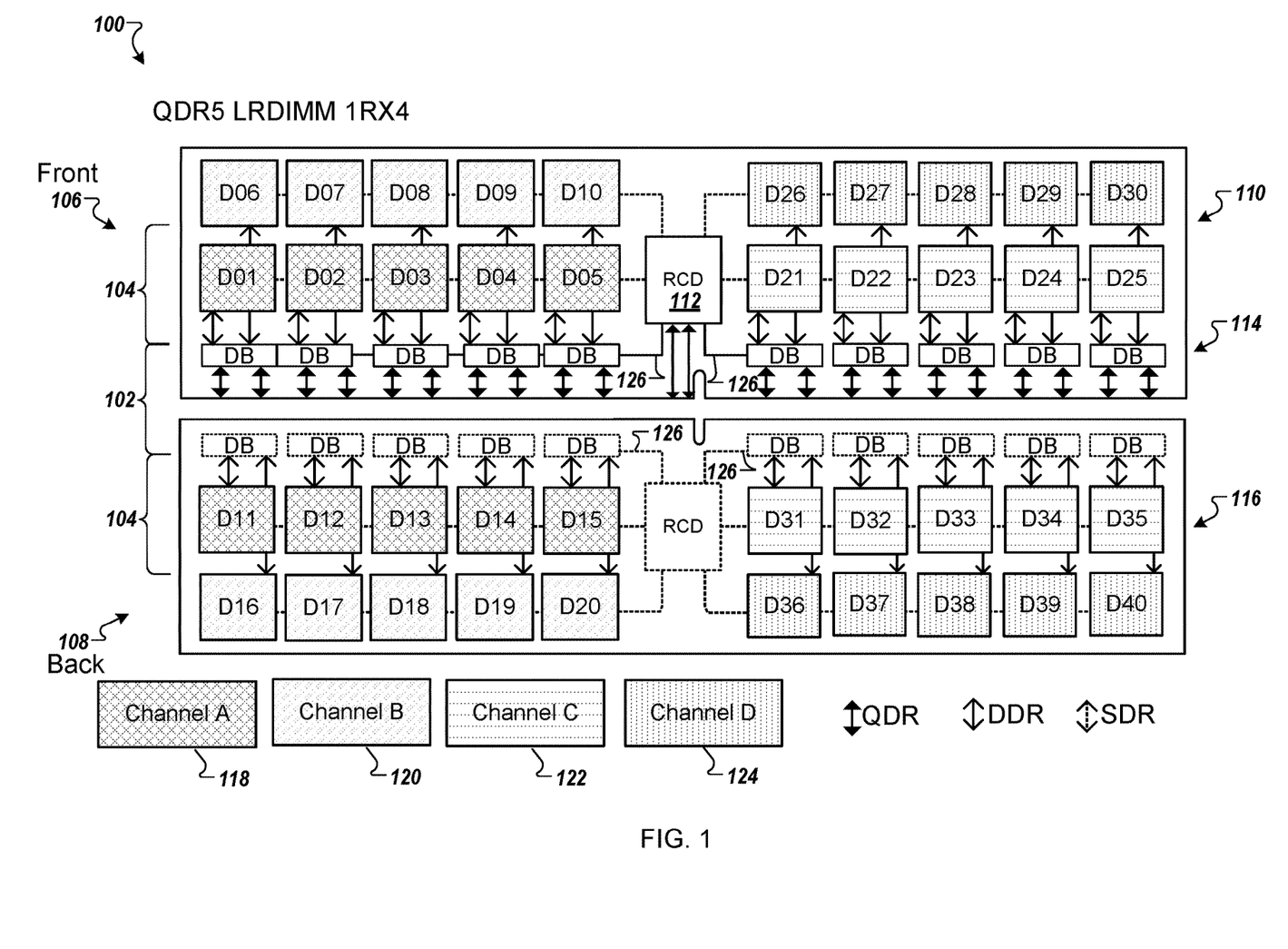
FIG. 1 is a block diagram of a dual in-line memory module (DIMM) with a quad-data-rate (QDR) host interface, according to at least one embodiment.

FIG. 1 is a block diagram of a dual in-line memory module (DIMM) 100 with a quad-data-rate (QDR) host interface 102, according to at least one embodiment. The QDR host interface 102 is an interface that operates QDR compared to a DRAM interface 104 that operates at DDR. On a front side 106 of the DIMM 100, the DIMM 100 includes multiple DRAM devices 110, an RCD 112, and multiple data buffer (DB) devices 114. On a back side 108 of the DIMM 100, the DIMM 100 includes multiple DRAM devices 116. The DRAM devices 110 and 116 are organized in four channels 118, 120, 122, and 124. As illustrated in FIG. 1, the first channel 118 includes five DRAM devices (D01-D05) from the DRAM devices 110 on the front side 106 and five DRAM devices (D11-D15) from the DRAM devices 116 on the back side 108. The second channel 120 includes five DRAM devices (D06-D10) from the DRAM devices 110 on the front side 106 and five DRAM devices (D16-D20) from the DRAM devices 116 on the back side 108. The third channel 122 includes five DRAM devices (D21-D25) from the DRAM devices 110 on the front side 106 and five DRAM devices (D31-D35) from the DRAM devices 116 on the back side 108. The fourth channel 124 includes five DRAM devices (D26-D30) from the DRAM devices 110 on the front side 106 and five DRAM devices (D36-D40) from the DRAM devices 116 on the back side 108.

In one embodiment, the first channel 118 and the second channel 120 are on the left side of the RCD 112, and the third channel 122 and the fourth channel 124 are on the right side of the RCD 112. Alternatively, the DRAM devices can be organized in multiple channels in other configurations. In other embodiments, other command buffer devices can be used instead of the RCD 112.

In at least one embodiment, the routings between the RCD and the DRAMs that are available in a two-rank DIMM (e.g., DDR5 dual-rank DIMM) can be leveraged for the DIMM 100. The DIMM 100 can have the same maximum of 40 DRAM devices on the DIMM, which is the same as DDR5, and can have the same maximum capacity as DDR5, and potentially relying on 3DS stacks for DIMM capacity increase.

In the illustrated embodiment, the DRAM interface data rate of the DRAM interface 104 is DDR and the host interface data rate of the host interface 102 is QDR, which is double the DRAM interface 104. The data lanes of the DRAM interface 104 can be controlled by control signals, such as data clock and strobe signals (DQ/DQS) and command and address (CA) signals and clock signals (QCA/QCK). For example, the DRAM devices 110 and 116 can operate at 6.4 Gbps for DQ/DQS/QCK and a single data rate (SDR) of 3.2 Gbps for QCA. In this embodiment, the host interface 102 operates at 12.8 Gbps. In this embodiment, there is a BCOM interface 126 (also referred to as the RCD to DB interface) between the RCD 112 and the DB devices 114. In this embodiment, the BCOM interface 126 operates at 6.4 Gpbs. Unless specifically stated otherwise, it is appreciated that throughout the description, discussions utilizing the term "SDR" refer to the general concept of transferring one bit on a data line with respect to each clock cycle of a reference clock, and not any JEDEC standard.

In at least one embodiment, to achieve QDR on the host interface 102, conversion circuitry (also referred to as gear boxes) can be added to the DB devices 114 and the RCD 112. In at least one embodiment, a 2:1 gear box can be added in the DB devices 114, and a 4:1 gear box can be added in the RCD 112. By doing this, the CPU to DRAM bandwidth will be improved.

In an embodiment, the DB's memory side is increased from an 8-bit interface to a 16-bit interface. In one embodiment, the RCD 112 can already include a 2:1 gear box that presents two copies of each channel's CA bus. The RCD 112 can include another 2:1 gear back that uses these two copies to generate another two copies, achieving a 4:1 gear box with no additional output bits. In at least one embodiment, the RCD 112 includes BCOM pins for communicating with the DB devices 114, and the BCOM pins can be either doubled (or operated at DDR rates) to double the bandwidth of control information sent to the set of DB devices 114.

As described above, the DIMM 100 can include four channels. In order to maintain 64B granularity and support QDR, the DIMM 100 has a total of 4 sub-channels. Some routing modifications can be made on DDR5 LRDIMM to support QDR. The DIMM 100 that operates at QDR can have the same DRAM capacity compared with current DDR5 DIMMs. The memory capacity is totally dependent on the number of DRAM devices, a number of dies stacked on each device, and the capacity of each memory die, as set forth in Table 1.

TABLE 1

|  | Total CPU memory Bandwidth | Total memory Capacity |
| --- | --- | --- |
| DDR5 | X | Y |
| QDR (DIMM 100) | 2X | Y |

On RDIMM/LRDIMM, the maximum limit of DRAM devices is 40. Due to this limitation, the DIMM 100 that operates at QDR can support a single-rank and quad-rank, but does not support dual-rank, since this would require 80 DRAM devices, which is more than the maximum limit of DRAM devices to fit on the DIMM 100. The DIMM 100 that operates at QDR with single-rank will have the same memory capacity as DDR5 with dual-rank. Overall, the DIMM 100 that operates at QDR can provide a solution to double DRAM bandwidth for a CPU (e.g., server CPU) while maintaining similar latency and capacity as DDR5.

As illustrated in FIG. 1, the DIMM 100 can be a QDR LRDIMM with a single-rank configuration. Nibble-based data flow arrows are shown between the DB devices 114 and the host device (not illustrated in FIG. 1). The host device can be a central processing unit (CPU) or the like. Compared to DDR5 LRDIMM with a dual-rank configuration, the channels of the DIMM 100 are increased from two to four. The total DRAM devices are still 40 (D01 to D40) on a QDR LRDIMM. The host to DB/RCD data rates are doubled from DDR to QDR on the host interface 102. The DB devices 114 can support fully independent write/read operations among the four channels 118-124 (labeled as Channel A/B/C/D). The BCOM interface 126 between RCD 112 and DB devices 114 requires double bandwidth. This can be done by either using DDR on the BCOM interface 126 (as shown in FIG. 1) or doubling the BCOM width (not shown in FIG. 1).

As illustrated in FIG. 1, two nibble-based data flow arrows are shown between each DB device 114 and the host device. Each DB device 114 receives two nibbles from the host device or sends two nibbles to the host device for a given transfer, as illustrated in FIG. 2.

Figure 2:
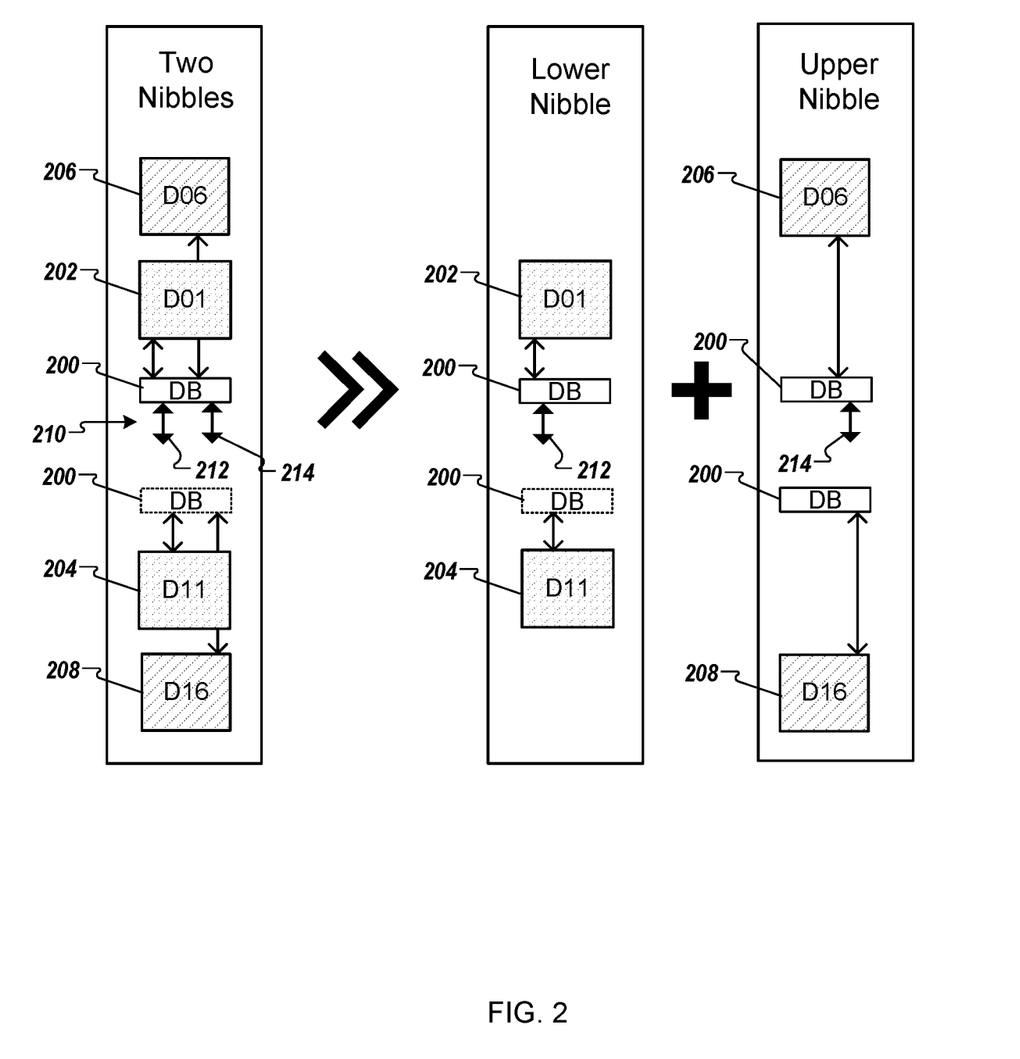
FIG. 2 is a block diagram of a data buffer (DB) device of a memory module that receives or sends two nibbles on a host interface, according to at least one embodiment.

FIG. 2 is a block diagram of a DB device 200 of a memory module that receives or sends two nibbles on a host interface, according to at least one embodiment. The DB device 200 is one of the DB devices 114 of FIG. 1. The DB device 200 is coupled to four DRAM devices 202-208. The DRAM devices 202-208 operate at a first specified data rate (e.g., DDR5 at 6.4 Gbps). The host interface 210 is the same as the host interface 102 of FIG. 1. The host interface 210 operates at QDR (e.g., 12.8 Gbps). Thus, the DB device 200 receives the two nibbles on the host interface 210 at a first rate. The DB device 200 includes a host-side interface circuit to send or receive first data to and from a host device at a quad data rate (QDR) that is higher than the first specified data rate. The host-side interface circuit can include a receiver, a transmitter, or both (e.g., a transceiver). The host-side interface circuit can use single-ended or differential signaling. The DB device 200 also includes a memory-side interface circuit to send or receive second data to and from the DRAM devices 202-208 at the first specified data rate. The memory-side interface circuit can include a receiver, a transmitter, or both (e.g., a transceiver). The memory-side interface circuit can use single-ended or differential signaling. The DB device 200 also includes conversion circuitry coupled between the host-side interface circuit and the memory-side circuit. The conversion circuitry is configured to down-convert the data at the quad data rate to the second data at the first specified data rate and up-convert the second data at the first specified data rate to the first data at the quad data rate.

As described above, the DB device 200 receives two nibbles 212 and 214 on a host interface 210. For understanding, FIG. 2 shows data paths of the first nibble 212 and data paths for the second nibble separately. The first nibble 212 can be a lower nibble, and the second nibble 214 can be an upper nibble. The first nibble 212 is received by the DB device 200 and sent to a first DRAM device 202 (e.g., D01 on a front side of the DIMM) and a second DRAM device 204 (e.g., D11 on a back side of the DIMM). The second nibble 214 is received by the DB device 200 and sent to a third DRAM device 206 (e.g., D06 on a front side of the DIMM) and a fourth DRAM device 208 (e.g., D16 on a back side of the DIMM). In the other direction, the nibbles can be received from the first and second DRAM devices 202 and 204 and sent to the host device as the first nibble 212, and the nibbles can be received from the third and fourth DRAM devices 206 and 208 and send to the host device as the second nibble 214.

As described above, the DB device 200 can send or receive two nibbles at a first rate on a host interface and send or receive nibbles at a second rate on a memory-side interface using conversion circuitry, illustrated in the circuit diagrams and timing diagrams of FIGS. 3A-3D.

Figure 3A:
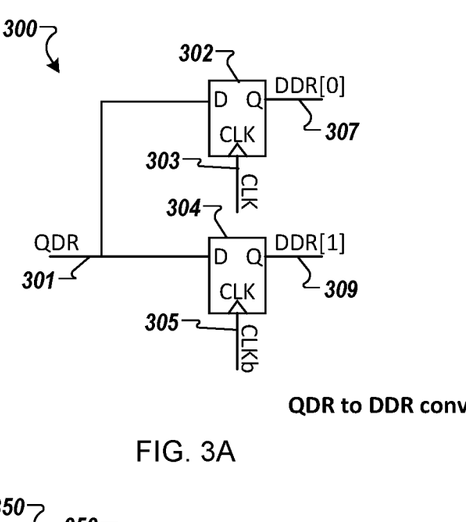
FIG. 3A is a schematic diagram of conversion circuitry to convert QDR to double-data-rate (DDR), according to at least one embodiment.

FIG. 3A is a schematic diagram of conversion circuitry 300 to convert QDR to DDR, according to at least one embodiment. The conversion circuitry 300 includes a first flip-flop 302 and a second flip-flop 304. The first and second flip-flops 302, 304 both receive an input signal 301 (QDR). The first flip-flop 302 is clocked by a first clock signal 303 (CLK), and the second flip-flop 304 is clocked by a second clock signal 305 (CLKb). The second clock signal 305 is an inverted clock signal of the first clock signal 303. The first flip-flop 302 outputs a first output signal 307 (DDR[0]) when clocked by a rising edge of the first clock signal 303. The second flip-flop 304 outputs a second output signal 309 (DDR[1]) when clocked by a rising edge of the second clock signal 305. In another embodiment, the second flip-flop 304 is clocked by the same clock signal as the first flip-flop 304 but outputs the second output signal 309 when clocked by a falling edge of the first clock signal 303. The conversion circuitry 300 allows the DB device to perform the QDR to DDR conversion. As illustrated in FIG. 3, the conversion circuitry 300 operates as a 2:1 gear box to improve the CPU to DRAM bandwidth by 2X. The conversion circuitry 300 allows the host interface to operate at twice the data rate of a memory interface. For example, if the memory interface operates at a double data rate (DDR), then the host interface can operate at a quad data rate (QDR) using the conversion circuitry 300.

Figure 3B:
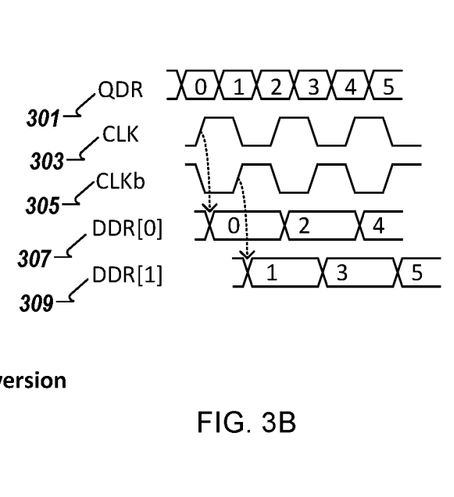
FIG. 3B is a timing diagram of the conversion circuitry of FIG. 3A, according to at least one embodiment.

FIG. 3B is a timing diagram of the conversion circuitry 300 of FIG. 3A, according to at least one embodiment. The timing diagram shows the timing of the input signal 301, the first and second clock signals 303, 305, and the first and second output signals 307, 309. As illustrated in FIG. 3B, the values of the input signal 301 are alternated between the first and second output signals 307, 309 using the conversion circuitry 300.

Figure 3C:
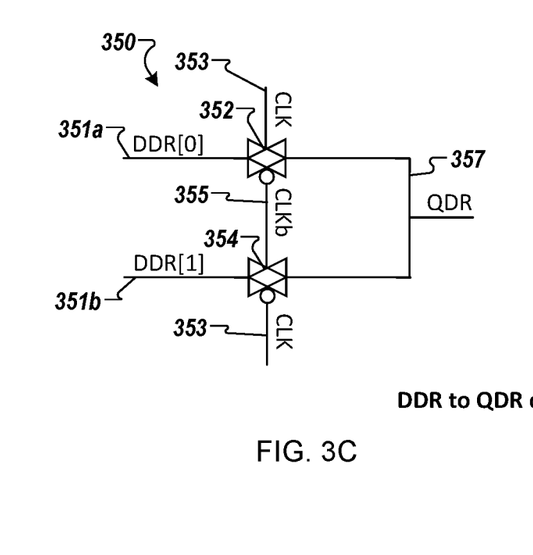
FIG. 3C is a schematic diagram of conversion circuitry to convert DDR to QDR, according to at least one embodiment.

FIG. 3C is a schematic diagram of conversion circuitry 350 to convert DDR to QDR, according to at least one embodiment. The conversion circuitry 350 includes a first transmission gate 352 (also referred to as a pass gate or relay) and a second transmission gate 354. The first transmission gate 352 receives a first input signal 351a (DDR[0]), and the second transmission gate 354 receives a second input signal 351b. The first transmission gate 352 is clocked by a first clock signal 353 (CLK), and the first transmission gate 352 outputs a second clock signal 355 (CLKb) used by the second transmission gate 354. Alternatively, the second transmission gate 354 is clocked by a second clock signal 355 received from a different source. The second clock signal 355 is an inverted clock signal of the first clock signal 353. The first transmission gate 352 outputs an output signal 357 (QDR) when clocked by a rising edge of the first clock signal 353. The second transmission gate 354 outputs the output signal 357 (QDR) when clocked by a rising edge of the second clock signal 355. In another embodiment, the second transmission gate 354 is clocked by the same clock signal as the first transmission gate 352 but outputs the output signal 357 when clocked by a falling edge of the first clock signal 353. The conversion circuitry 350 allows the DB device to perform the QDR to DDR conversion. As illustrated in FIG. 3, the conversion circuitry 300 operates as a 2:1 gear box to improve the CPU to DRAM bandwidth by 2X. The conversion circuitry 300 allows the host interface to operate at twice the data rate of a memory interface. For example, if the memory interface operates at a double data rate (DDR), then the host interface can operate at a quad data rate (QDR) using the conversion circuitry 300.

Figure 3D:
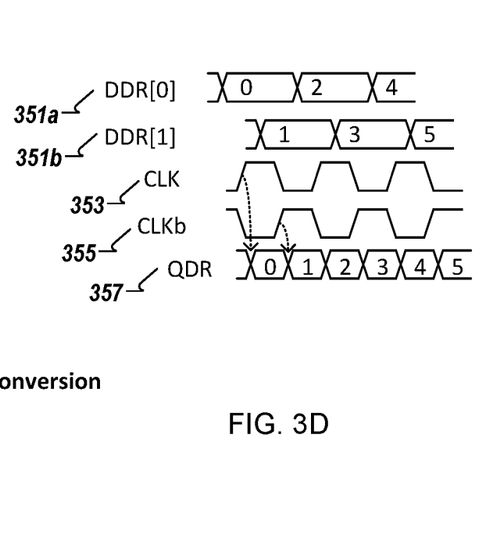
FIG. 3D is a timing diagram of the conversion circuitry of FIG. 3C, according to at least one embodiment.

FIG. 3D is a timing diagram of the conversion circuitry 350 of FIG. 3C, according to at least one embodiment. The timing diagram shows the timing of the first input signal 351a and the second input signal 351b, the first and second clock signals 353, 355, and the output signal 357. As illustrated in FIG. 3B, the values of the output signal 357 include values alternated between the values of the first and second input signals 351a, 351b using the conversion circuitry 350.

Figure 4:
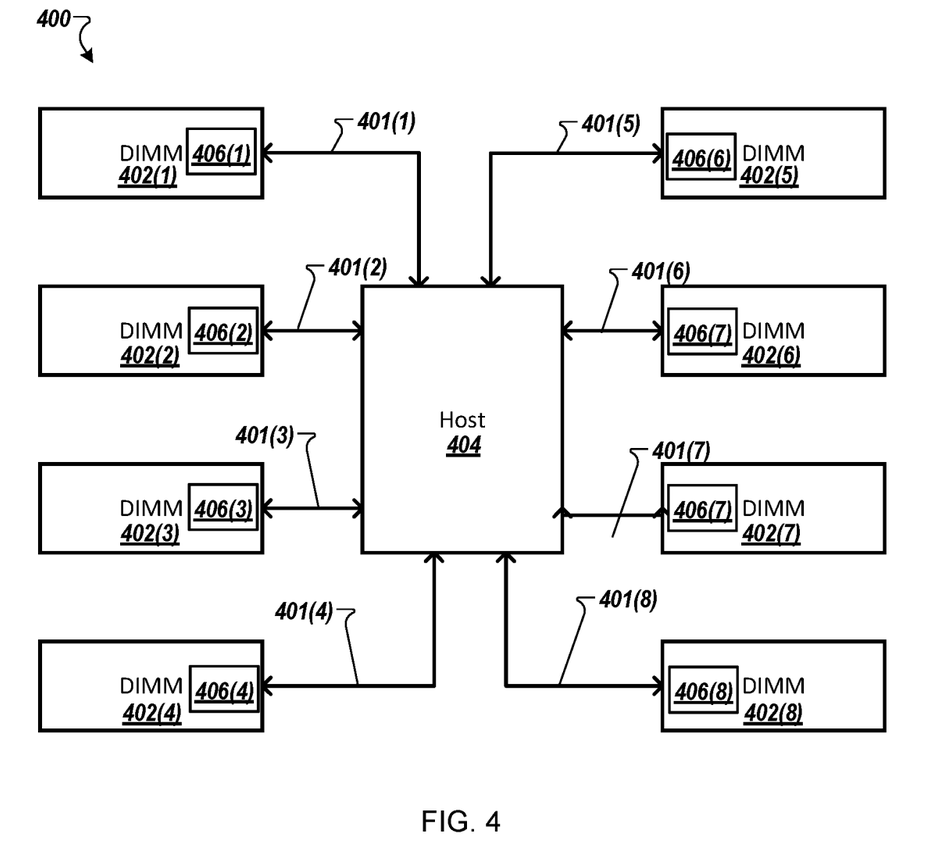
FIG. 4 is a block diagram of a memory system with multiple DIMMs coupled to a host device, according to at least one embodiment.

FIG. 4 is a block diagram of a memory system 400 with multiple DIMMs 402 coupled to a host device 404, according to at least one embodiment. The memory system 400 includes eight DIMMs 402 coupled to the host device 404, each DIMM 402 being coupled to the host device 404 via a QDR host interface 401. The host device 404 can be a server CPU of a server platform. The server platform can support 1 SPC with one DIMM 402 on each channel. Each DIMM 402 can include multiple DRAMs organized in four sub-channels as described above with respect to FIG. 1. The interfaces of the DRAMs of the DIMMs 402 operate at DDR at a first specified data rate. The DIMMs 402 each include conversion circuitry that down-converts and up-converts the data communicated between the DRAM devices and the host device 404. The conversion circuitry 406 allows the data being sent to the host device 404 to be up-converted from the first specified data rate to a second specified data rate, which is greater than the first specified data rate. Interface circuitry of the DIMMs 402 and the host device 404 communicate with QDR at the second specified data rate. The conversion circuit 406 allows the data received from the host device 404 to be down-converted from the second specified data rate to the first specified data rate. For example, first conversion circuitry 406(1) of a first DIMM 402(1) sends or receives first data to and from the host device 404 at 12.8 Gbps (QDR) and sends or receives second data to and from the DRAM devices of the first DIMM 402(1) at 6.4 Gbps (DDR). The first conversion circuitry 406(1) down-converts the first data at 12.8 Gbps to the second data at 6.4 Gbps and up-converts the second data at 6.4 Gbps to the first data at 12.8 Gbps.

In one embodiment, the conversion circuitry 406 includes first conversion circuitry in DB devices that down-converts and up-converts data signals on data paths between the DRAM devices and the host device 404 and second conversion circuitry in an RCD device that down-converts control signals on control paths between the DRAM devices and the host device 404. As described herein, the first conversion circuitry can operate at the same or different specified data rates as the second conversion circuitry. In one embodiment, the first conversion circuitry 406(1) includes a first conversion circuit in an RCD of the first DIMM 402(1) and a second conversion circuit in each DB device of the first DEV IM 402(1). The second conversion circuit converts from QDR to DDR for host-to-DRAM traffic, and converts from DDR to QDR for DRAM-to-host traffic; and the first conversion circuit converts from QDR and SDR for the host-to-DRAM traffic. In another embodiment, the second conversion circuit can convert clock signals in addition to converting command signals. For example, the interface between the host and the RCD can be QDR, where a clock signal (CK) and DRAM clock are the same) or the host interface can be DDR with respect to the CK in which case the CK is divided by 2 before sending to the DRAM.

In one embodiment, the first DIMM 402(1) includes memory devices organized as a first memory channel (e.g., channel A 118), a second memory channel (e.g., channel B 120), a third memory channel (e.g., C 122, and a fourth memory channel (e.g., D 124). Each memory device sends or receives data at a first specified data rate (e.g., DDR). The first DIMM 402(1) includes a first set of data buffer devices (e.g., the five DB devices 114 at a left side of DIMM 100 of FIG. 1). Each data buffer device in the first set is coupled to a memory device in the first memory channel and a memory device in the second memory channel. The first DIMM 402(1) includes a second set of data buffer devices (e.g., the five DB devices 114 at a right side of DIMM 100 of FIG. 1). Each data buffer device in the second set is coupled to a memory device in the third memory channel and a memory device in the fourth memory channel. The first DIMM 402(1) includes a host-side data interface coupled between the first and second sets of data buffer devices and the host device 404. The first set of data buffer devices and the second set of data buffer devices send or receive the data via the host-side data interface at a quad data rate that is higher than the first specified data rate. In a further embodiment, the first DIMM 402(1) includes a command buffer device (e.g., RCD) coupled to the memory devices and the first and second sets of data buffers. The first DIMM 402(1) includes a host-side command interface coupled between the command buffer device and the host device 404. The first DIMM 402(1) includes a memory-side command interface coupled between the command buffer device and the memory devices. The command buffer device receives first commands from the host device 404 at the quad data rate and sends second commands, corresponding to the first commands, to one or more of the memory devices at either the first specified data rate (e.g., DDR) or a second specified data rate that is lower than the first specified data rate (e.g., SDR). In at least one embodiment, the first specified data rate is approximately 6.4 Gbps, the second specified data rate is approximately 3.2 Gbps, and the quad data rate is approximately 12.8 Gbps.

In another embodiment, the first DIMM 402(1) includes a command buffer device coupled to the memory devices and the first and second sets of data buffer devices. The first DIMM 402(1) includes a host-side command interface coupled between the command buffer device and the host device 404. The first DIMM 402(1) includes a first memory-side command interface and a second memory-side command interface. The first memory-side command interface is coupled between the command buffer device and the memory devices. The second memory-side command interface is coupled between the command buffer device and the first and second sets of data buffer devices. The second memory-side command interface can be a BCOM interface. In this embodiment, the command buffer device receives the first commands from the host device 404 at the quad data rate. The command buffer device sends second commands, corresponding to the first commands, to at least some of the memory devices at either the first specified data rate or the second specified data rate that is lower than the first specified data rate. The command buffer device sends third commands, corresponding to the first commands, to at least some of the first and second sets of data buffer devices at either the first specified data rate or the second specified data rate.

In one embodiment, the server platform of the memory system 400 and the host device 404 can operate at a quad data rate of 12800 MT/s while using DRAM devices that operate at a double data rate. In at least one embodiment, the memory devices are DDR5 DRAM devices, and the memory system 400 can double the host-memory bandwidth while using DDR5 DRAM devices. The memory system 400 can maintain low RCD/DB latency (tPDM), similarly to DDR5. The DRAM side can have 40-bits per channel at DDR5 rates and can have 64B access granularity. The memory system 400 can similarly implement ChipKill and ECC protection as DDR5. In at least one embodiment, the DIMMs 402 are LRDIMMs that use QDR interfaces at both the host-side DB and the RCD, where the DB/RCD connects to multiple channels, converting QDR to native DRAM data rates in a time-multiplexed manner, as described herein. The native DRAM data rates can be DDR for data signals and SDR for command and address signals. In some embodiments, the BCOM interface can use double data rate signaling. In some embodiments, each DB device translates two QDR nibbles on the host side to four DDR nibbles on the DRAM side for the corresponding two DRAM channels.

Figure 5:
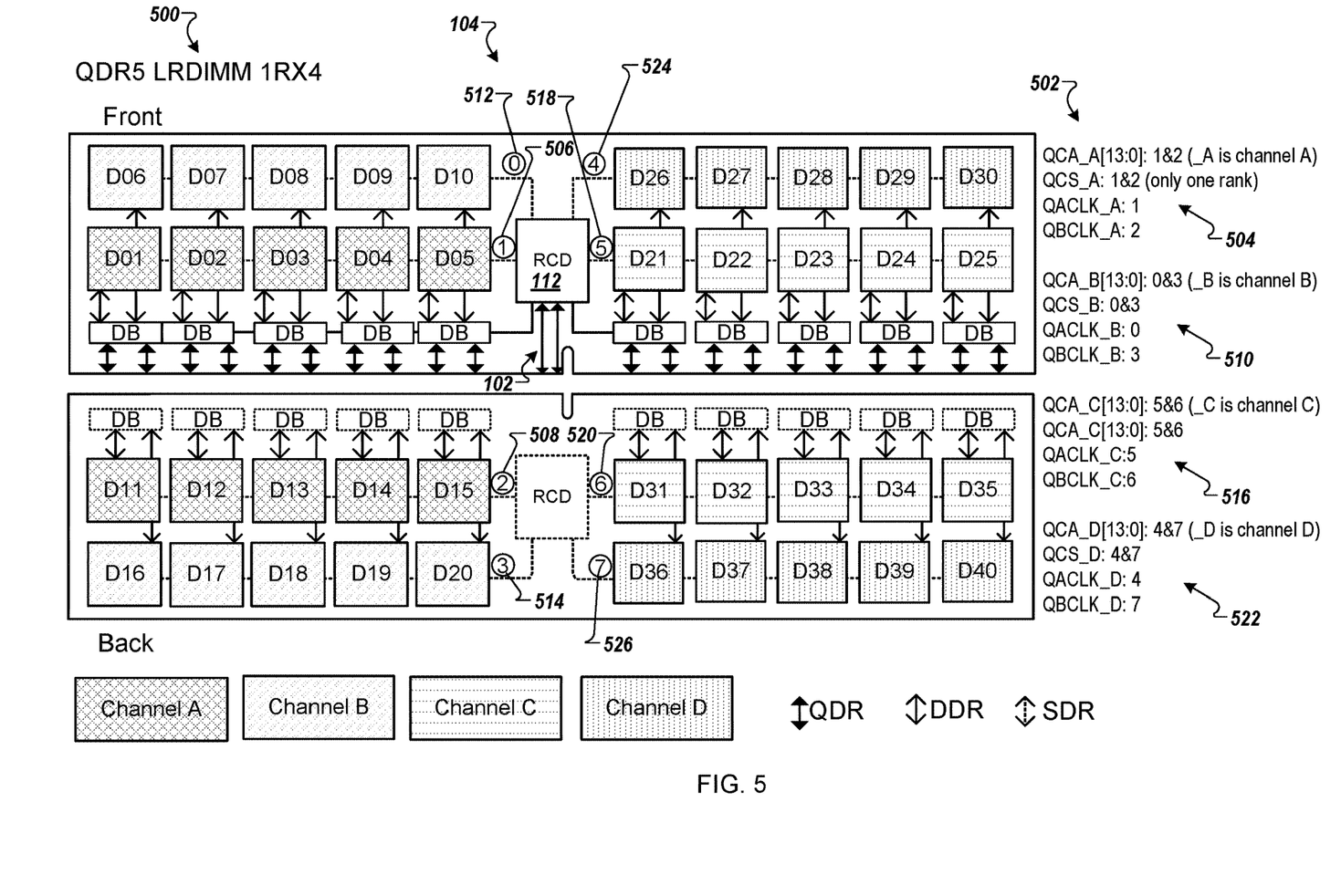
FIG. 5 is a block diagram of a DIMM with a QDR host interface with four channels, according to at least one embodiment.

FIG. 5 is a block diagram of a DIMM 500 with a QDR host interface with four channels, according to at least one embodiment. The DIMM 500 is the same as the DIMM 100 of FIG. 1, except FIG. 5 shows post-RCD signals 502 to control access to DRAM devices in the four different channels. As described above, the RCD 112 receives CA signals from the host device over the host interface 102 at QDR. The RCD 112 sends the post-RCD signals 502 to the DRAM devices over the DRAM interface 104 at DDR and/or SDR (e.g., QCLK signals are DDR, and QCA/QCS signals are SDR).

When Channel A (D01-D05 and D11-D15) is being accessed, the RCD 112 sends a first subset 504 of signals on a physical bus with separate clock lines 506 and 508, including address signals QCA_A[13:0], chip select signal QCS_A (only one rank), and clock signals QACLK_A, QBCLK_A. It should be noted that the address signals QCA_A[13:0] and chip select signal QCS_A are sent on the bus, but the clock signal QACLK_A is sent on the clock lines 506, and the clock signal QBCLK_A is sent on the clock lines 508.

When Channel B (D06-D10 and D16-D20) is being accessed, the RCD 112 sends a second subset 510 of signals on the physical bus with separate clock lines 512 and 514, including address signals QCA_B[13:0], chip select signal QCS_B (only one rank), and clock signals QACLK_B, QBCLK_B. It should be noted that the address signals QCA_B[13:0] and chip select signal QCS_B are sent on the bus, but the clock signal QACLK_B is sent on the clock lines 512, and the clock signal QBCLK_B is sent on the clock lines 514.

When Channel C (D21-D25 and D31-D35) is being accessed, the RCD 112 sends a third subset 516 of signals on the physical bus with separate clock lines 518 and 520, including address signals QCA_C[13:0], chip select signal QCS_C (only one rank), and clock signals QACLK_C, QBCLK_C. It should be noted that the address signals QCA_C[13:0] and chip select signal QCS_C are sent on the bus, but the clock signal QACLK_C is sent on the clock lines 518, and the clock signal QBCLK_C is sent on the clock lines 520.

When Channel D (D26-D30 and D36-D40) is being accessed, the RCD 112 sends a fourth subset 522 of signals on the physical bus with separate clock lines 524 and 526, including address signals QCA_D[13:0], chip select signal QCS_D (only one rank), and clock signals QACLK_D, QBCLK_D. It should be noted that the address signals QCA_D[13:0] and chip select signal QCS_D are sent on the bus, but the clock signal QACLK_D is sent on the clock lines 524, and the clock signal QBCLK_D is sent on the clock lines 526.

Figure 6:
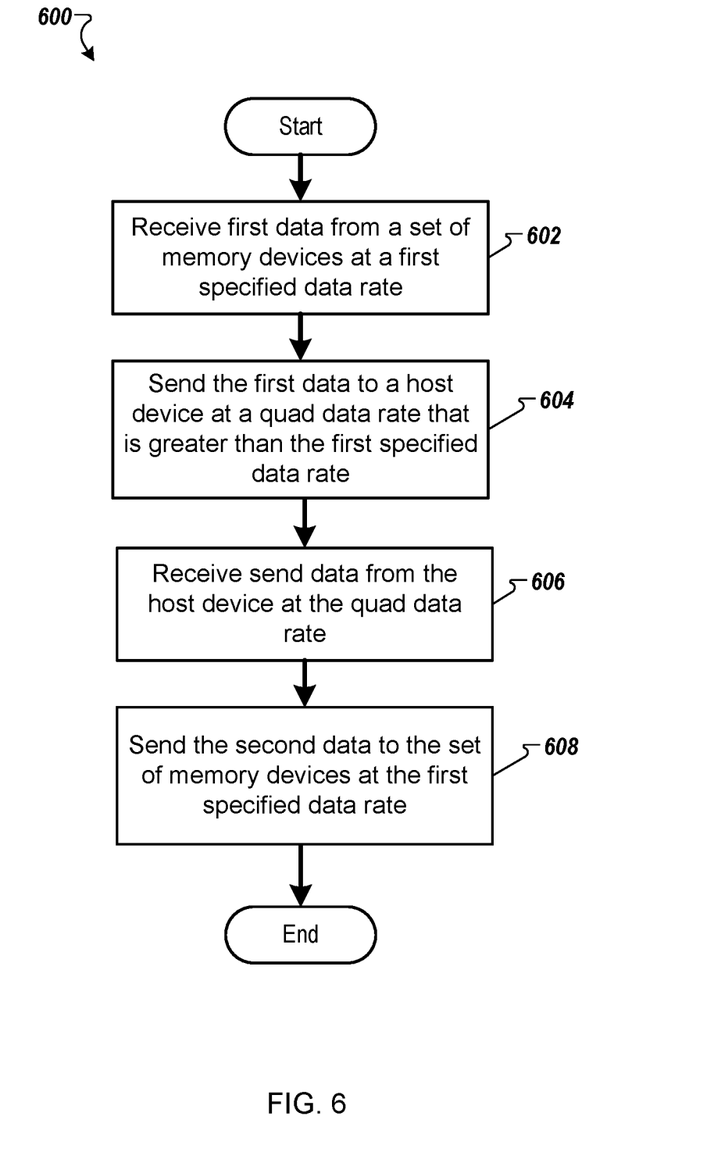
FIG. 6 is a flow diagram of a method for operating a memory module with a QDR interface, according to an embodiment.

FIG. 6 is a flow diagram of a method 600 for operating a memory module with a QDR interface, according to an embodiment. The method 600 may be performed by processing logic that may comprise hardware (e.g., circuitry, dedicated logic, programmable logic, microcode, etc.), software (e.g., instructions run on a processing device to perform hardware simulation), or a combination thereof. In one embodiment, the method 600 is performed by the DIMM 100 of FIG. 1. In one embodiment, the method 600 is performed by one or more of the DB devices 114 of FIG. 1. In one embodiment, the method 600 is performed by any of the DIMMs 402 of FIG. 4. In one embodiment, the method 600 is performed by the DIMM 500 of FIG. 5. In another embodiment, the method 600 is performed by any of the interface circuits described above.

Referring to FIG. 6, the method 600 begins by the processing logic receiving first data from a set of memory devices at a first specified data rate (block 602). The processing logic sends the first data to a host device at a quad data rate that is higher than the first specified data rate (block 604). The processing logic receives second data from the host device at the quad data rate (block 606). The processing logic sends the second data to the set of memory devices at the first specified data rate (block 608), and the method 600 ends.

In a further embodiment, the processing logic converts the first data at the first specified data rate to the quad data rate using first conversion circuitry. The processing logic converts the second data at the quad data rate to the first data rate using second conversion circuitry. In at least one embodiment, the first specified data rate is approximately 6.4 Gbps, and the quad data rate is approximately 12.8 Gbps. Alternatively, other data rates can be used.

Figure 7:
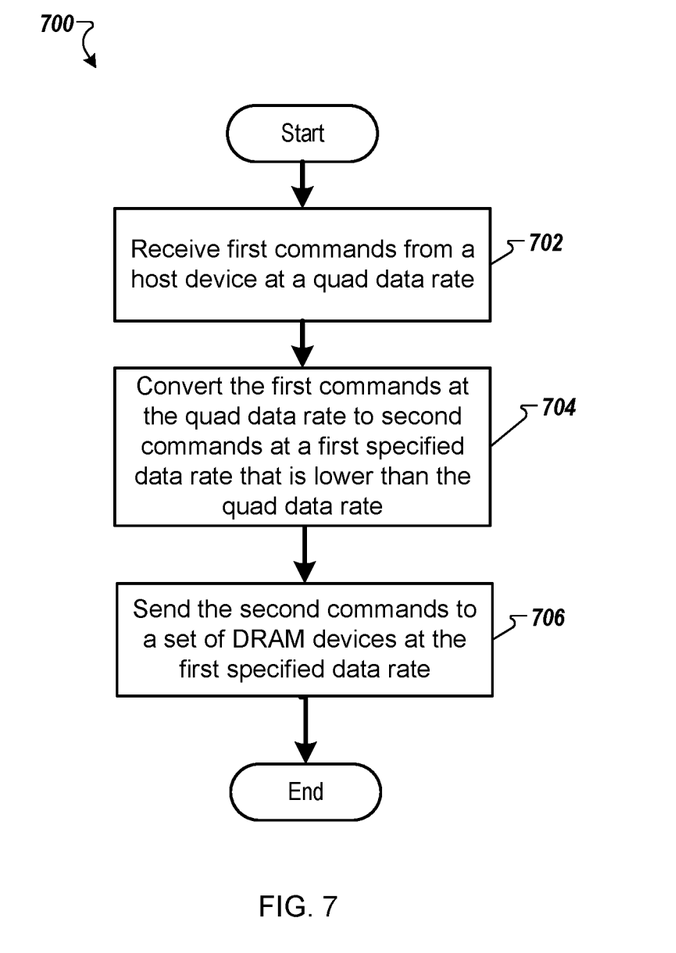
FIG. 7 is a flow diagram of a method for operating a memory module with a QDR interface, according to an embodiment.

FIG. 7 is a flow diagram of a method 700 for operating a memory module with a QDR interface, according to an embodiment. The method 700 may be performed by processing logic that may comprise hardware (e.g., circuitry, dedicated logic, programmable logic, microcode, etc.), software (e.g., instructions run on a processing device to perform hardware simulation), or a combination thereof. In one embodiment, the method 700 is performed by the DIMM 100 of FIG. 1. In one embodiment, the method 700 is performed by the RCD 112 of FIG. 1. In one embodiment, the method 700 is performed by any of the DIMMs 402 of FIG. 4. In one embodiment, the method 700 is performed by the DIMM 500 of FIG. 5. In another embodiment, the method 700 is performed by any of the interface circuits described above.

Referring to FIG. 7, the method 700 begins by the processing logic first commands from a host device at a quad data rate (block 702). The processing logic converts the first commands at the quad data rate into second commands at a first specified data rate (block 704). The processing logic sends the second commands, corresponding to the first commands, to a set of memory devices and/or data buffer devices at the first specified data rate (block 706), and the method 700 ends.

In a further embodiment, the processing logic converts the first commands at the quad data rate to the first specified data rate using conversion circuitry. In at least one embodiment, the first specified data rate is approximately 6.4 Gbps, and the quad data rate is approximately 12.8 Gbps. Alternatively, other data rates can be used.

In another embodiment, the processing logic converts the first commands at the quad data rate into second commands and third commands. The second commands are sent to the set of memory devices, and the third commands are sent to DB devices. In one embodiment, the second commands are at the first specified data rate, and the third commands are at the first specified data rate. In another embodiment, the second commands are at the first specified data rate, and the third commands are at a second specified data rate that is lower than the first specified data rate. In at least one embodiment, the first specified data rate is approximately 6.4 Gbps, the second specified data rate is approximately 3.2 Gbps, and the quad data rate is approximately 12.8 Gbps. Alternatively, other data rates can be used.

It is to be understood that the above description is intended to be illustrative, and not restrictive. Many other implementations will be apparent to those of skill in the art upon reading and understanding the above description. Therefore, the disclosure scope should be determined with reference to the appended claims, along with the full scope of equivalents to which such claims are entitled.

In the above description, numerous details are set forth. It will be apparent, however, to one skilled in the art, that the aspects of the present disclosure may be practiced without these specific details. In some instances, well-known structures and devices are shown in block diagram form, rather than in detail, in order to avoid obscuring the present disclosure.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

However, it should be borne in mind that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "receiving," "determining," "selecting," "storing," "setting," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present disclosure also relates to an apparatus for performing the operations herein. This apparatus may be specially constructed for the required purposes, or it may comprise a general-purpose computer selectively activated or reconfigured by a computer program stored in the computer. Such a computer program may be stored in a computer-readable storage medium, such as, but not limited to, any type of disk, including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems may be used with programs in accordance with the teachings herein, or it may prove convenient to construct more specialized apparatuses to perform the required method steps. The required structure for a variety of these systems will appear as set forth in the description. In addition, aspects of the present disclosure are not described with reference to any particular programming language. It will be appreciated that a variety of programming languages may be used to implement the teachings of the present disclosure as described herein.

Aspects of the present disclosure may be provided as a computer program product, or software, that may include a machine-readable medium having stored thereon instructions, which may be used to program a computer system (or other electronic devices) to perform a process according to the present disclosure. A machine-readable medium includes any procedure for storing or transmitting information in a form readable by a machine (e.g., a computer). For example, a machine-readable (e.g., computer-readable) medium includes a machine (e.g., a computer) readable storage medium (e.g., read-only memory ("ROM"), random access memory ("RAM"), magnetic disk storage media, optical storage media, flash memory devices, etc.).

What is claimed is:

1. A memory module comprising:
    a plurality of memory devices to send or receive data at a first specified data rate, wherein the first specified data rate is a double data rate (DDR) in which two bits are transferred on a data line with respect to each clock cycle of a reference clock;
    one or more data buffer devices coupled to the plurality of memory devices, each of the one or more the data buffer devices comprising:
        a first host-side interface circuit to send or receive first data to and from a host device at a quad data rate (QDR), wherein, for the quad data rate, four bits are transferred on a data line with respect to each clock cycle of the reference clock;
        a first memory-side interface circuit to send or receive second data to and from the plurality of memory devices at the first specified data rate; and
        first conversion circuitry to down-convert the first data at the QDR to the second data at the first specified data rate and up-convert the second data at the first specified data rate to the first data at the QDR; and
    a command buffer device coupled to the plurality of memory devices, the command buffer device comprising:
        a second host-side interface circuit to receive first commands from the host device at the quad data rate;
        a second memory-side interface circuit to send second commands, corresponding to the first commands, to the plurality of memory devices at a second specified data rate; and
        second conversion circuitry to down-convert the first commands at the quad data rate to the second commands at the second specified data rate.

2. The memory module of claim 1, wherein the first specified data rate is approximately 6.4 Gbps, and the QDR is approximately 12.8 Gbps.

3. The memory module of claim 1,
    wherein the second memory-side interface circuit to send the second commands, corresponding to the first commands, to the one or more data buffer devices at the second specified data rate.

4. The memory module of claim 3, wherein the second specified data rate is a double data rate (DDR).

5. The memory module of claim 3, wherein the second specified data rate is a single data rate (SDR) in which one bit is transferred on a data line with respect to each clock cycle of the reference clock.

6. The memory module of claim 1, wherein the command buffer device further comprises
    a third memory-side interface circuit to send third commands, corresponding to the first commands, to the one or more data buffer devices at a third specified data rate, wherein the second conversion circuitry to down-convert the first commands at the quad data rate to the third commands at the third specified data rate.

7. The memory module of claim 6, wherein the third specified data rate is a double data rate (DDR), and the second specified data rate is a single data rate (SDR).

8. The memory module of claim 6, wherein the first specified data rate is approximately 6.4 Gbps, the second specified data rate is approximately 3.2 Gbps, and the quad data rate is approximately 12.8 Gbps.

9. A memory module comprising:
    a plurality of memory devices organized as a first memory channel, a second memory channel, a third memory channel, and a fourth memory channel, each memory device of the plurality of memory devices is to send or receive data at a first specified data rate, wherein the first specified data rate is a double data rate (DDR) in which two bits are transferred on a data line with respect to each clock cycle of a reference clock;
    a first set of data buffer devices, each data buffer device in the first set being coupled to a memory device in the first memory channel and a memory device in the second memory channel;
    a second set of data buffer devices, each data buffer device in the second set being coupled to a memory device in the third memory channel and a memory device in the fourth memory channel; and
    a host-side data interface coupled between the first and second sets of data buffer devices and a host device, wherein the first set of data buffer devices and the second set of data buffer devices are to send or receive the data via the host-side data interface at a quad data rate (QDR), wherein, for the quad data rate, four bits are transferred on a data line with respect to each clock cycle of the reference clock.

10. The memory module of claim 9, wherein the first specified data rate is approximately 6.4 Gbps, and the quad data rate is approximately 12.8 Gbps.

11. The memory module of claim 9, further comprising:
a command buffer device coupled to the plurality of memory devices, the first set of data buffer devices, and the second set of data buffer devices;
a host-side command interface coupled between the command buffer device and the host device; and
a memory-side command interface coupled between the command buffer device and the plurality of memory devices, wherein the command buffer device is to receive first commands from a host device at the quad data rate and to send second commands, corresponding to the first commands, to at least some of the plurality of memory devices at either the first specified data rate or a second specified data rate that is lower than the first specified data rate.

12. The memory module of claim 11, wherein the first specified data rate is approximately 6.4 Gbps, the second specified data rate is approximately 3.2 Gbps, and the quad data rate is approximately 12.8 Gbps.

13. The memory module of claim 12, wherein the first specified data rate is approximately 6.4 Gbps, the second specified data rate is approximately 3.2 Gbps, and the quad data rate is approximately 12.8 Gbps.

14. The memory module of claim 11, further comprising:
a command buffer device coupled to the plurality of memory devices, the first set of data buffer devices, and the second set of data buffer devices;
a host-side command interface coupled between the command buffer device and a host device;
a first memory-side command interface coupled between the command buffer device and the plurality of memory devices; and
a second memory-side command interface coupled between the command buffer device and the first set of data buffer devices and the second set of data buffer devices, wherein the command buffer device is to:
receive first commands from a host device at the quad data rate;
send second commands, corresponding to the first commands, to at least some of the plurality of memory devices at either the first specified data rate or a second specified data rate that is lower than the first specified data rate; and
send third commands, corresponding to the first commands, to at least some of the first set of data buffer devices and the second set of data buffer devices at either the first specified data rate or the second specified data rate.

15. A method comprising:
receiving, by a data buffer device, first data from a plurality of memory devices at a first specified data rate, wherein the first specified data rate is a double data rate (DDR) in which two bits are transferred on a data line with respect to each clock cycle of a reference clock;
sending, by the data buffer device, the first data to a host device at a quad data rate, wherein, for the quad data rate, four bits are transferred on a data line with respect to each clock cycle of the reference clock;
receiving, by the data buffer device, second data from the host device at the quad data rate;
sending, by the data buffer device, the second data to the plurality of memory devices at the first specified data rate;
receiving, by a command buffer device, first commands from the host device at the quad data rate;
sending, by the command buffer device, second commands, corresponding to the first commands, to the plurality of memory devices at a second specified data rate; and
down-converting the first commands at the quad data rate to the second commands at the second specified data rate.

16. The method of claim 15, wherein the first specified data rate is approximately 6.4 Gbps, and the quad data rate is approximately 12.8 Gbps.

17. The method of claim 15, further comprising:
sending, by the command buffer device, the second commands, corresponding to the first commands, to the data buffer device at the first specified data rate or the second specified data rate.

18. The method of claim 17, wherein the first specified data rate is approximately 6.4 Gbps, the second specified data rate is approximately 3.2 Gbps, and the quad data rate is approximately 12.8 Gbps.

19. The method of claim 17, wherein the second specified data rate is a single data rate (SDR) in which one bit is transferred on a data line with respect to each clock cycle of the reference clock.

* * * * *